(12) United States Patent
Nickol et al.

(10) Patent No.: US 12,150,259 B2
(45) Date of Patent: Nov. 19, 2024

(54) CONTAINERS HAVING A MECHANICAL TOLERANCE COMPENSATORY ELEMENT

(71) Applicant: Lear Corporation, Southfield, MI (US)

(72) Inventors: Georg Nickol, Stockheim (DE); Dominik Fischer, Kronach (DE)

(73) Assignee: Lear Corporation, Southfield, MI (US)

( * ) Notice: Subject to any disclaimer, the term of this patent is extended or adjusted under 35 U.S.C. 154(b) by 273 days.

(21) Appl. No.: 17/718,913

(22) Filed: Apr. 12, 2022

(65) Prior Publication Data

US 2022/0346251 A1    Oct. 27, 2022

(30) Foreign Application Priority Data

Apr. 21, 2021 (DE) .......................... 102021110115.8

(51) Int. Cl.
| | |
|---|---|
| *H05K 7/20* | (2006.01) |
| *H05K 5/02* | (2006.01) |
| *H05K 5/03* | (2006.01) |

(52) U.S. Cl.
CPC ............. *H05K 5/0217* (2013.01); *H05K 5/03* (2013.01)

(58) Field of Classification Search
CPC .. H05K 7/1404; H05K 7/1407; H05K 7/1428; H05K 5/0004; H05K 5/0008
See application file for complete search history.

(56) References Cited

U.S. PATENT DOCUMENTS

| 8,665,601 B1 | 3/2014 | Mangay-Ayam et al. |
| 2003/0133257 A1 | 7/2003 | Beihoff et al. |
| 2003/0133259 A1 | 7/2003 | Meyer et al. |
| 2005/0099763 A1 | 5/2005 | Rathburn |
| 2006/0044768 A1* | 3/2006 | Mizutani ................ H05K 5/006 361/752 |
| 2007/0263342 A1 | 11/2007 | Johnson |
| 2008/0089020 A1 | 4/2008 | Hiew et al. |
| 2010/0103632 A1* | 4/2010 | Kato ...................... H05K 5/006 361/752 |
| 2011/0188174 A1 | 8/2011 | Simper et al. |

(Continued)

FOREIGN PATENT DOCUMENTS

| DE | 102019104301 A1 | 10/2019 |
| DE | 102007038737 A1 | 12/2021 |

OTHER PUBLICATIONS

German Office Action, Application No. 102021110115.8, mailed Jan. 26, 2022.

*Primary Examiner* — Anthony Q Edwards
(74) *Attorney, Agent, or Firm* — MacMillan, Sobanski & Todd, LLC

(57) ABSTRACT

A container that has a mechanical tolerance compensatory element includes a housing, an electronic assembly, a cover, and an attachment member. The housing defines an electronic assembly recess. The electronic assembly is disposed within the electronic assembly recess and contacts the housing. The cover is attached to the housing, has a center, and defines an attachment member portion, a slot, and a first projection. The slot is disposed between the attachment member portion and the center of the cover. The first projection extends into the electronic assembly recess and contacts the electronic assembly such that the electronic assembly is retained between the housing and the cover. The attachment member is disposed at the attachment member portion defined by the cover and attaches the cover to the housing.

20 Claims, 10 Drawing Sheets

(56) References Cited

U.S. PATENT DOCUMENTS

| | | | |
|---|---|---|---|
| 2018/0213658 A1* | 7/2018 | Nuriya | H05K 5/006 |
| 2019/0313538 A1* | 10/2019 | Watanabe | H05K 5/0052 |
| 2020/0313609 A1 | 10/2020 | Sella et al. | |

* cited by examiner

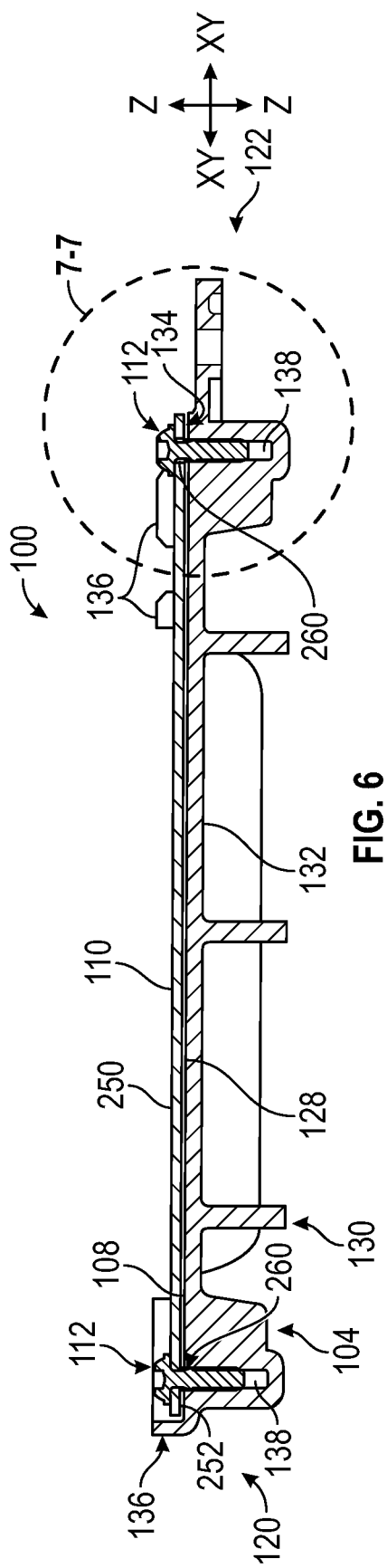
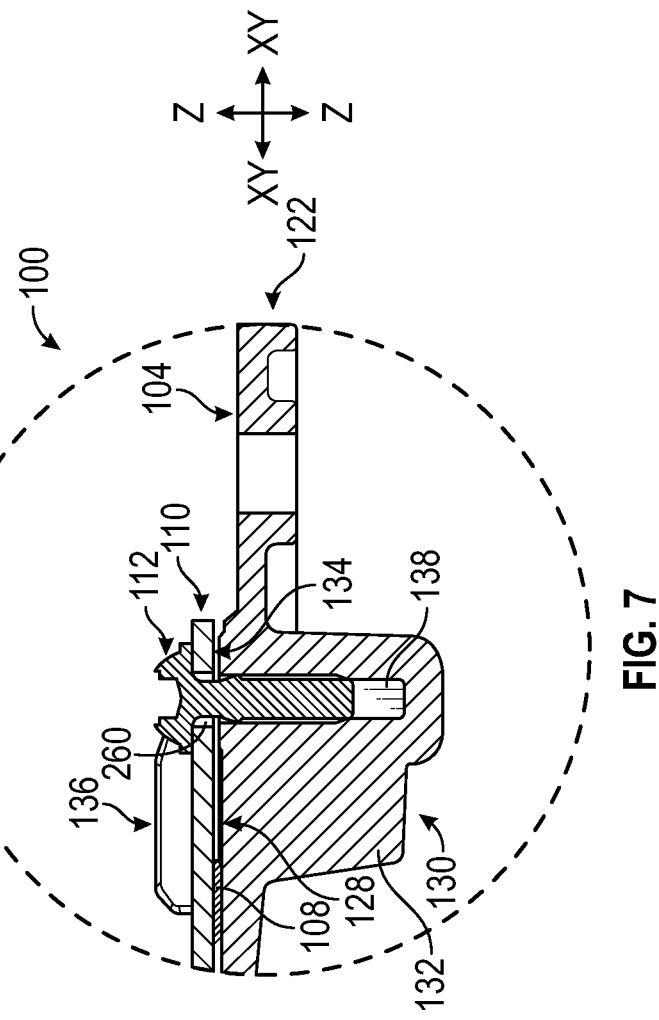

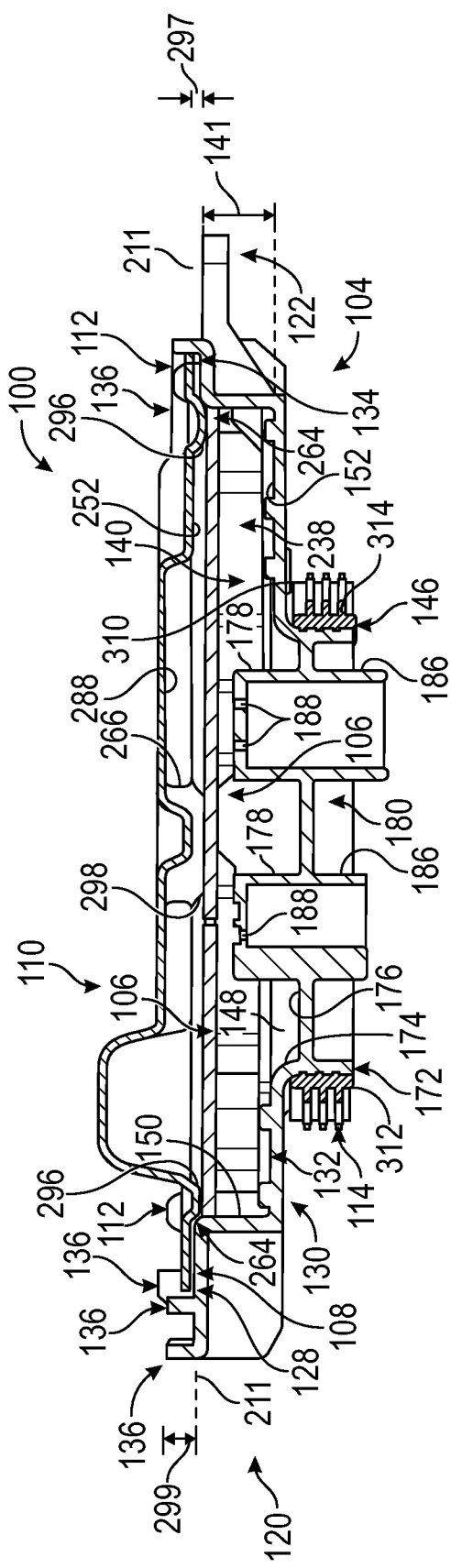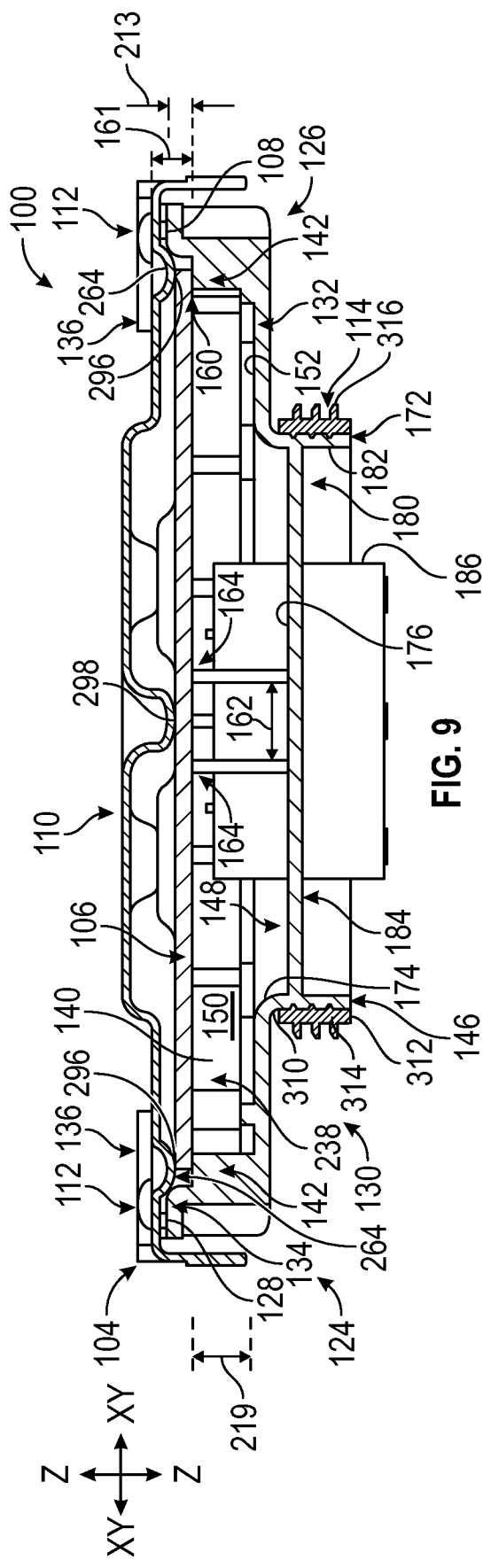

CONTAINERS HAVING A MECHANICAL TOLERANCE COMPENSATORY ELEMENT

BACKGROUND OF THE INVENTION

The disclosure relates generally to the field of containers for electronic assemblies. More particularly, the disclosure relates to containers that have a mechanical tolerance compensatory element.

Conventional containers that include electronic assemblies often include a housing, a cover, and an electronic assembly directly attached to the housing using a plurality of screws. As a result of the direct attachment between the electronic assembly and the housing, mechanical stresses may be applied to the electronic assembly during the manufacturing process and movement of the electronic assembly (e.g., as a result of temperature-dependent expansions) is prevented during use.

For example, as shown in FIG. 1, a conventional container 10 has a housing 12, an electronic assembly 14, a cover 16, and a plurality of screws 18. The electronic assembly 14 and cover 16 are directly attached to the housing 12 using the plurality of screws 18, each of which passes through a passageway 20 defined by the cover 16, a passageway 22 defined by the electronic assembly 14, and into a recess 24 defined by the housing 12. As shown in FIG. 2, another conventional container 30 has a housing 32, an electronic assembly 34, a cover 36, a plurality of screws 38, and a plurality of rivets 40. In this example, the electronic assembly 34 is directly attached to the housing 32 using the plurality of screws 38, each of which passes through a passageway 42 defined by the electronic assembly 34 and into a recess 44 defined by the housing 32, and the cover 36 is directly attached to the housing 32 using the plurality of rivets 40, each of which passes through a passageway 46 defined by the cover 36. As a result of the direct attachment between the electronic assembly 14 and housing 12 and between the electronic assembly 34 and housing 32, mechanical stresses may be applied to the electronic assemblies 14, 34 during manufacture. Furthermore, movement of the electronic assemblies 14, 34 (e.g., as a result of temperature-dependent expansions) may be prevented in the x-y plane and along the z axis.

A need exists, therefore, for new and useful containers that include a mechanical tolerance compensatory element.

SUMMARY OF THE INVENTION

Various example containers that have a mechanical tolerance compensatory element are described herein.

An example container has a housing, an electronic assembly, a cover, and an attachment member. The housing defines an electronic assembly recess. The electronic assembly is disposed within the electronic assembly recess defined by the housing and contacts the housing. The cover is attached to the housing. The cover has a center and defines an attachment member portion, a slot, and a first projection. The slot is disposed between the attachment member portion and the center of the cover. The first projection extends into the electronic assembly recess and contacts the electronic assembly such that the electronic assembly is retained between the housing and the cover. The attachment member is disposed on the attachment member portion defined by the cover and attaches the cover to the housing.

Another example container has a housing, an electronic assembly, a cover, and an attachment member. The housing defines an attachment member recess, an electronic assembly recess, and a support member. The electronic assembly recess is bounded by an electronic assembly recess sidewall and an electronic assembly recess base. The support member extends from the electronic assembly recess sidewall into the electronic assembly recess. The electronic assembly is disposed within the electronic assembly recess defined by the housing and directly contacts the housing. The electronic assembly is disposed on the support member within the electronic assembly recess. The cover is attached to the housing. The cover has an outer edge, a central portion, a flexible portion, and defines an attachment member passageway, a slot, and a first projection. The flexible portion is moveable relative to the central portion and extends from the slot to the outer edge. The slot is disposed between the attachment member passageway and the first projection. The first projection extends into the electronic assembly recess and directly contacts the electronic assembly such that the electronic assembly is retained between the housing and the cover. The attachment member is partially disposed through the attachment member passageway defined by the cover and is partially disposed within the attachment member recess defined by the housing.

Another example container has a housing, an electronic assembly, a cover, and an attachment member. The housing has a receiving surface and defines an attachment member recess, an electronic assembly recess, a support member, and an electronic assembly projection. The electronic assembly recess extends from the receiving surface and into the housing. The electronic assembly recess is bounded by an electronic assembly recess sidewall and an electronic assembly recess base. The support member extends from the electronic assembly recess sidewall into the electronic assembly recess. The electronic assembly projection extends from the electronic assembly recess sidewall into the electronic assembly recess. The electronic assembly is disposed within the electronic assembly recess defined by the housing and directly contacts the housing. The electronic assembly has a thickness, defines a notch, and is disposed on the support member within the electronic assembly recess. The cover is attached to the housing. The cover has an outer edge, a central portion, a flexible portion, and defines an attachment member passageway, a slot, and a first projection. The flexible portion is moveable relative to the central portion and extends from the slot to the outer edge. The flexible portion includes the attachment member passageway. The slot is disposed between the attachment member passageway and the first projection. The first projection extends into the electronic assembly recess and directly contacts the electronic assembly such that the electronic assembly is retained between the housing and the cover. The attachment member is partially disposed through the attachment member passageway defined by the cover and is partially disposed within the attachment member recess defined by the housing. The support member is disposed a distance from the receiving surface that is greater than the thickness of the electronic assembly. The electronic assembly projection is disposed within the notch defined by the electronic assembly.

Additional understanding of these examples can be obtained by review of the detailed description, below, and the appended drawings.

Various aspects of this invention will become apparent to those skilled in the art from the following detailed description of the preferred embodiment, when read in light of the accompanying drawings.

BRIEF DESCRIPTION OF THE DRAWINGS

FIG. 6 is a cross-sectional view of the container illustrated in FIG. 3 taken along line 6-6.

FIG. 7 is a magnified view of area 7-7 shown in FIG. 6.

FIG. 8 is a cross-sectional view of the container illustrated in FIG. 3 taken along line 8-8.

FIG. 9 is a cross-sectional view of the container illustrated in FIG. 3 taken along line 9-9.

DETAILED DESCRIPTION OF THE PREFERRED EMBODIMENT

Figure 1:
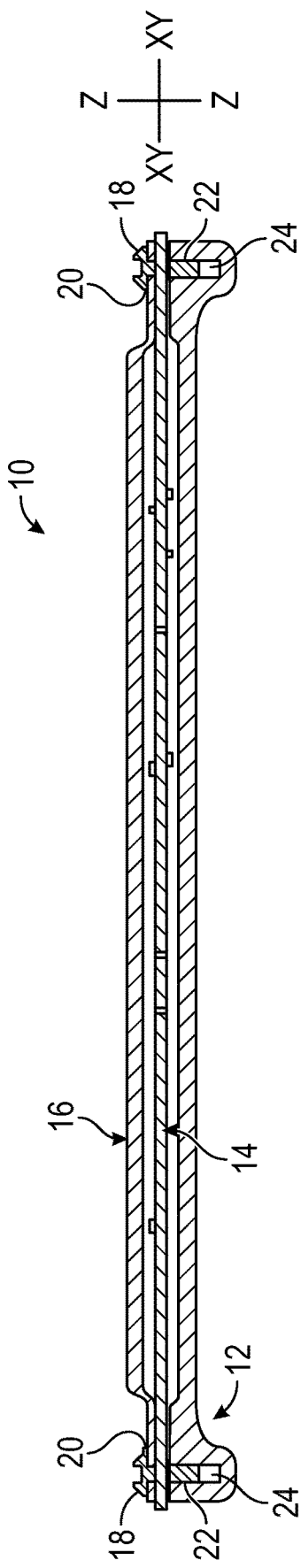
FIG. 1 is a cross-sectional view of a first prior art container for an electronic assembly.
Figure 2:
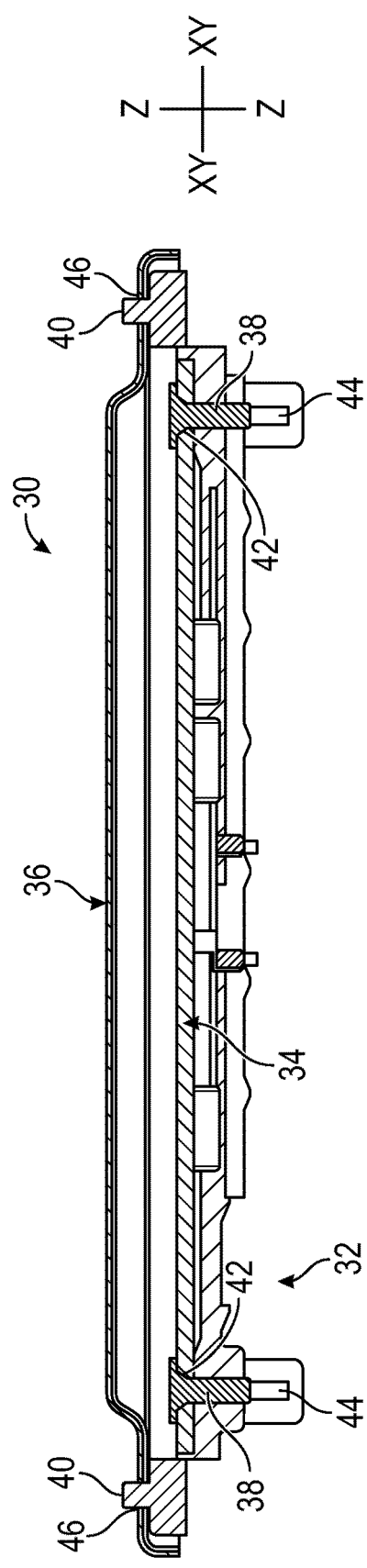
FIG. 2 is a cross-sectional view of a second prior art container for an electronic assembly.

The following detailed description and the appended drawings describe and illustrate various example embodiments of containers that have a mechanical tolerance compensatory element. The description and illustration of these examples are provided to enable one skilled in the art to make and use a container that has a mechanical tolerance compensatory element. They are not intended to limit the scope of the claims in any manner.

FIGS. 3 through 16 illustrate a first embodiment of a container 100 that has a first mechanical tolerance compensatory element 102 and a second mechanical compensatory element 103, as described in more detail herein. In the illustrated embodiment, the container 100 has a housing 104, an electronic assembly 106, a first sealing member 108, a cover 110, a plurality of attachment members 112, and a second sealing member 114.

In the illustrated embodiment, the housing 104 has a lengthwise axis 105, a first end 120, a second end 122, a first side 124, a second side 126, a top surface 128, a bottom surface 130, and a main body 132 that defines a receiving surface 134, a plurality of projections 136, a plurality of attachment member recesses 138, an electronic assembly recess 140, a plurality of support members 142, a plurality of electronic assembly projections 144, a base projection 146, and a base projection recess 148.

The receiving surface 134 is defined on the top surface 128 of the housing 104 and, in the illustrated embodiment, is a planar surface that is sized to receive the first sealing member 108 and the cover 110, as described in more detail herein. However, alternative embodiments can include a receiving surface that is not planar. Each projection of the plurality of projections 136 extends from the receiving surface 134 and away from the bottom surface 130 and is sized to be disposed within a notch of the plurality of notches 258 defined by the cover 110, as described in more detail herein. Each attachment member recess of the plurality of attachment member recesses 138 extends from the receiving surface 134, toward the bottom surface 130, and is sized to receive an attachment member of the plurality of attachment members 112 to achieve releasable attachment between the attachment member and the housing 104.

The electronic assembly recess 140 is disposed between the plurality of attachment member recesses 138, is sized to receive the electronic assembly 106, extends from the receiving surface 134 and into the housing 104, and is bounded by an electronic assembly recess sidewall 150 and an electronic assembly recess base 152. In the illustrated embodiment, the electronic assembly recess 140 extends from the receiving surface 134 and toward the bottom surface 130. As, shown in FIG. 8, the electronic assembly recess 140 has a depth 141 that extends from the receiving surface 134 to the electronic assembly recess base 152. The electronic assembly recess 140 is disposed between a first set of attachment member recesses 154 of the plurality of attachment member recesses 138 and between a second set of attachment member recesses 156 of the plurality of attachment member recesses 138 such that each attachment member recess of the plurality of attachment member recesses 138 is disposed outside of the electronic assembly recess 140 and does not extend into the electronic assembly recess 140.

Each support member of the plurality of support members 142 is disposed within the electronic assembly recess 140. In the illustrated embodiment, each support member of the plurality of support members 142 is entirely disposed within the electronic assembly recess 140. A first set of support members 158 of the plurality of support members 142 extends from the electronic assembly recess sidewall 150 into the electronic assembly recess 140 and from the electronic assembly recess base 152 and away from the bottom surface 130 to a support member top surface 160. Alternative embodiments, however, can include a first set of support members that extend from a location between an electronic assembly recess base and a top surface to a support member top surface. As shown in FIG. 9, the support member top surface 160 is disposed a distance 161 from the receiving surface 134 that is greater than the thickness 213 of the electronic assembly 106 such that the electronic assembly 106 rests upon and contacts the support member top surface 160. A second set of support members 162 of the plurality of support members 142 extends from the projection recess base 176, as described in more detail herein, toward the electronic assembly 106 to a support member top surface 164 that is coplanar with the top surface 160 of each support member of the first set of support members 158 such that the electronic assembly 106 rests upon and contacts the support member top surface 164 when the container 100 is assembled.

Figure 15:
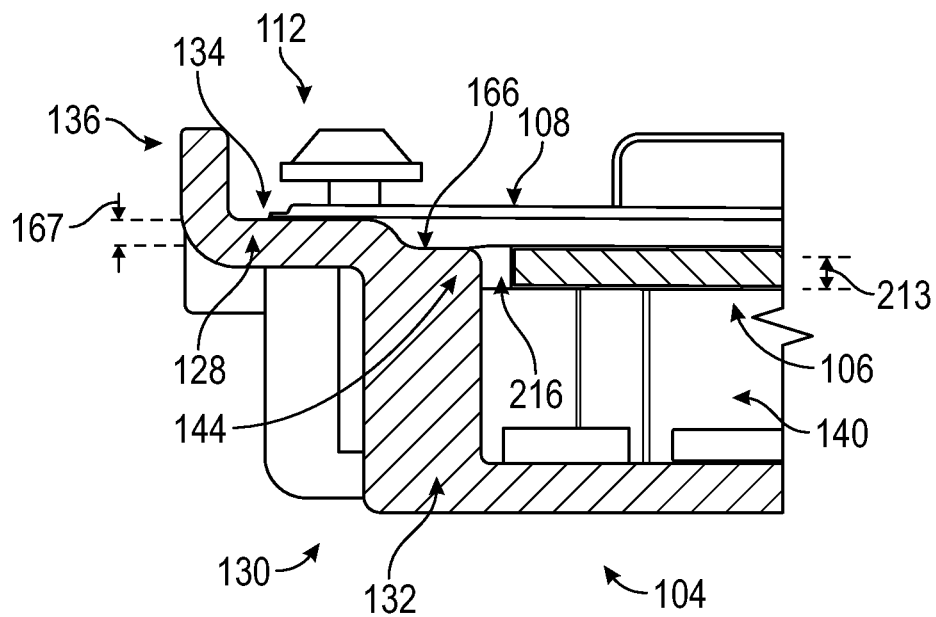
FIG. 15 is a partial cross-sectional view of the housing, electronic assembly, sealing member, and attachment members illustrated in FIG. 13 taken along line 15-15.
Figure 16:
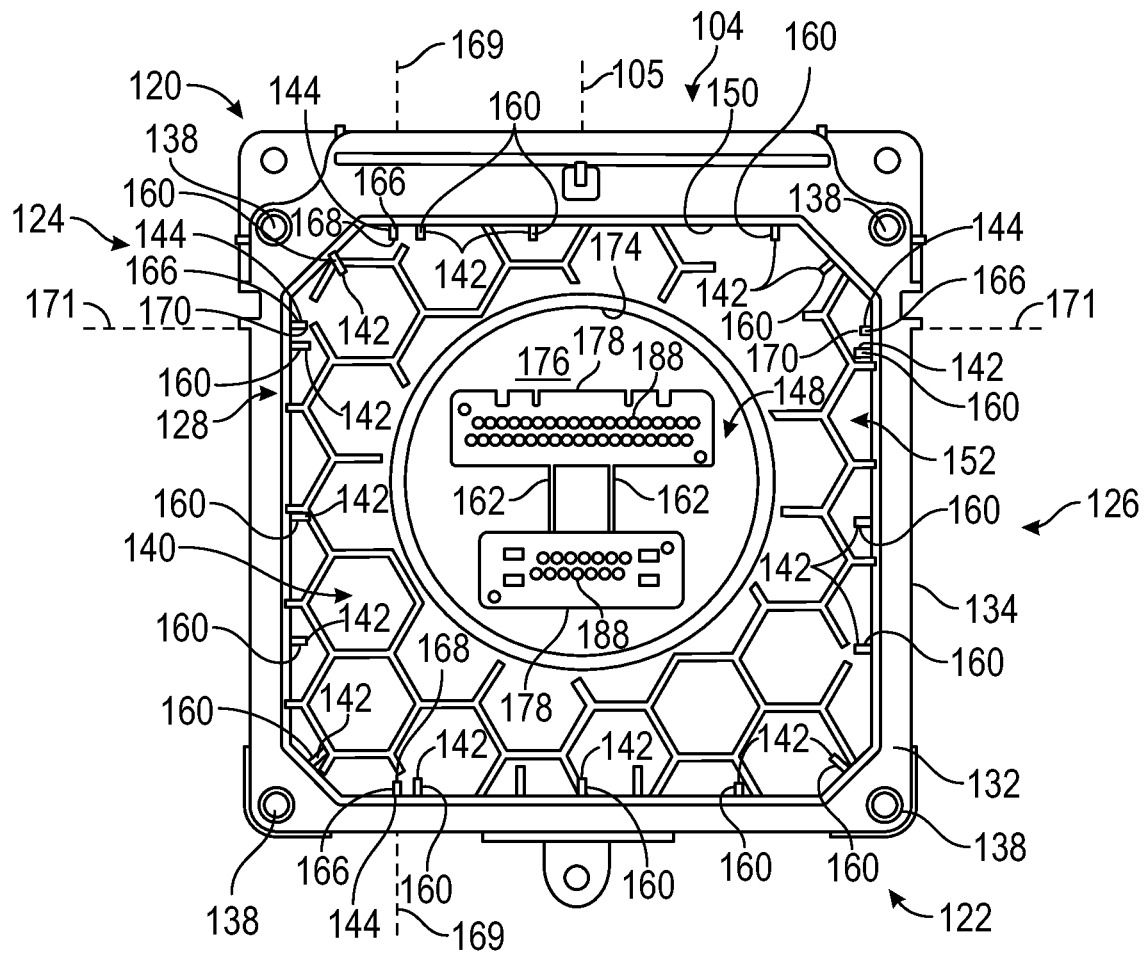
FIG. 16 is a top view of the housing of the container illustrated in FIG. 5.

Each electronic assembly projection of the plurality of electronic assembly projections 144 is disposed within the electronic assembly recess 140. In the illustrated embodiment, each electronic assembly projection of the plurality of electronic assembly projections 144 is entirely disposed within the electronic assembly recess 140. Each electronic assembly projection of the plurality of electronic assembly projections 144 extends from the electronic assembly recess sidewall 150 into the electronic assembly recess 140 and from the electronic assembly recess base 152 and away from the bottom surface 130 to a projection top surface 166. Alternative embodiments, however, can include electronic assembly projections that extend from a location between an electronic assembly recess base and a top surface to a support member top surface. As shown in FIG. 15, the top surface 166 of each electronic assembly projection of the plurality of electronic assembly projections 144 is disposed a distance 167 from the receiving surface 134 that is less than the thickness 213 of the electronic assembly 106 such that each electronic assembly projection of the plurality of electronic assembly projections 144 extends into, and is disposed within, a notch of the plurality of notches 216 defined by the electronic assembly 106, as described in more detail herein. As shown in FIG. 16, a first set of electronic assembly projections 168 of the plurality of electronic assembly projections 144 is disposed on a first axis 169. In the illustrated embodiment, the first axis 169 is disposed parallel to the lengthwise axis 105 of the housing 104 and between the lengthwise axis 105 of the housing 104 and the first side 124. However, alternative embodiments can include a first axis that disposed at any suitable angle relative to a lengthwise axis of a housing and is positioned at any suitable location relative to a lengthwise axis of a housing and a side of a housing. A second set of electronic assembly projections 170 of the plurality of electronic assembly projections 144 is disposed on a second axis 171 that is disposed at an angle relative to the first axis 169. In the illustrated embodiment, the second axis 171 is disposed perpendicular to the first axis 169 and closer to the first end 120 of the housing than the second end 122 of the housing 104. However, alternative embodiments can include a second axis that disposed at any suitable angle relative to a first axis and is positioned at any suitable location relative to an end of a housing.

The base projection 146 extends from the bottom surface 130 and away from the top surface 128 to a base projection end 172 and is sized to be received by the second sealing member 114. The base projection recess 148 extends from the electronic assembly recess base 152 toward the base projection end 172. The base projection recess 148 is defined by a base projection recess sidewall 174 and a base projection recess base 176. A plurality of terminal projections 178 extend from the base projection recess base 176 and into the electronic assembly recess 140. A second base projection recess 180 extends from the base projection end 172 toward the electronic assembly recess 140. The second base projection recess 180 is defined by a second base projection recess sidewall 182 and a second base projection recess base 184. A plurality of terminal projections 186 extend from the second base projection recess base 184 and away from the electronic assembly recess 140. A plurality of passageways 188 extend through the terminal projections 178, 186. Each passageway of the plurality of passageways 188 is sized to receive an electrical connector to connect the electronic assembly 106 to a secondary component. Depending on the structural arrangement of a component to which a container is intended to be attached, a base projection and/or base projection recess can be omitted from a container.

While the housing 104 has been illustrated as having a particular structural arrangement, a housing can have any suitable structural arrangement and selection of a suitable structural arrangement for a housing can be based on various considerations, including the type of electronic assembly intended to be positioned within the housing. For example, a housing can include any suitable number of projections, attachment member recesses, electronic assembly recesses, support members, electronic assembly projections, and/or base projections. Alternatively, a housing can omit the inclusion of an attachment member recess, or plurality of attachment member recesses, and include an attachment member portion that can include any suitable structure that can be used to accomplish attachment between a housing and a cover. For example, a housing can define a support post that can be passed through a passageway defined by a cover and used to attach the cover to the housing (e.g., using a bolt).

A housing can be formed of any suitable material using any suitable technique or method of manufacture and selection of a suitable material to form a housing and of a suitable technique or method to manufacture a housing can be based on various consideration, such as the material forming a cover intended to be releasably attached to a housing. Examples of materials considered suitable to form a housing include plastics, metals, such as aluminum, alloys, and any other material considered suitable for a particular embodiment. Examples of techniques and methods of manufacture considered suitable to form a housing include pressing, molding, such as injection molding, and any other technique or method of manufacture considered suitable for a particular embodiment. In the illustrated embodiment, the housing 104 is formed of a plastic.

In the illustrated embodiment, the electronic assembly 106 is disposed within the electronic assembly recess 140 defined by the housing 104, directly contacts the housing 104, is free from direct attachment to the housing 104, and is disposed on the plurality of support members 142. In the illustrated embodiment, free from direct attachment to the housing 104 indicates that an attachment member of the plurality of attachment members 112 that is attached to the housing 104 and cover 110 and does not pass through the electronic assembly 106, allowing any thermal expansion of the housing 104, electronic assembly 106, and/or cover 110 during use to occur while reducing, or preventing, the mechanical stress imparted on the electronic assembly 106, as described in more detail herein. The electronic assembly 106 has a lengthwise axis 201, a first end 202, a second end 204, a first side 206, a second side 208, a top surface 210, a bottom surface 212, a thickness 213, and a main body 214 that defines a plurality of notches 216 and an outer edge 218. While illustrated as including a plurality of notches, an electronic assembly can include any suitable number of notches. The thickness 213 of the electronic assembly 106 extends from the top surface 210 to the bottom surface 212. As shown in FIG. 9, the electronic assembly 106 is disposed a distance 219 from the electronic assembly recess base 152.

Figure 13:
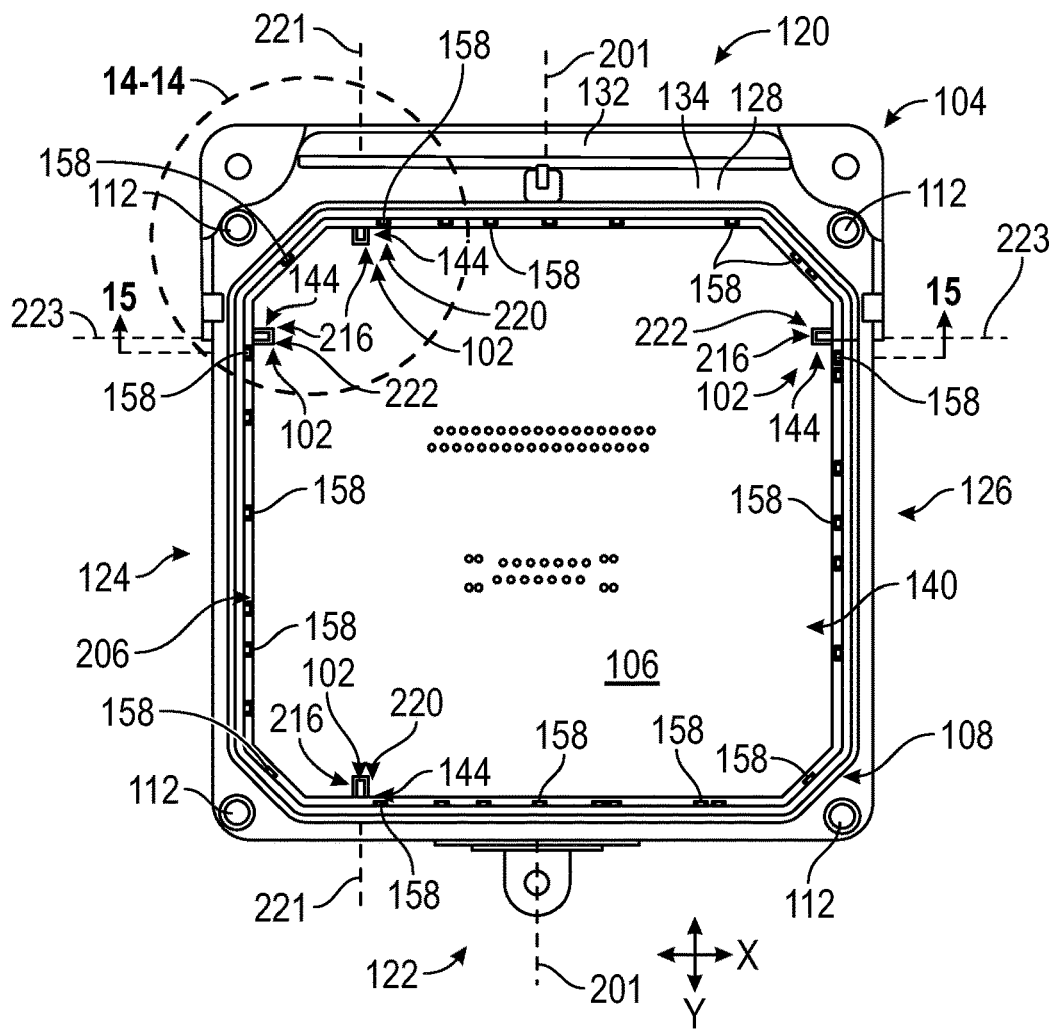
FIG. 13 is a top view of the housing, electronic assembly, sealing member, and attachment members of the container illustrated in FIG. 5.
Figure 14:
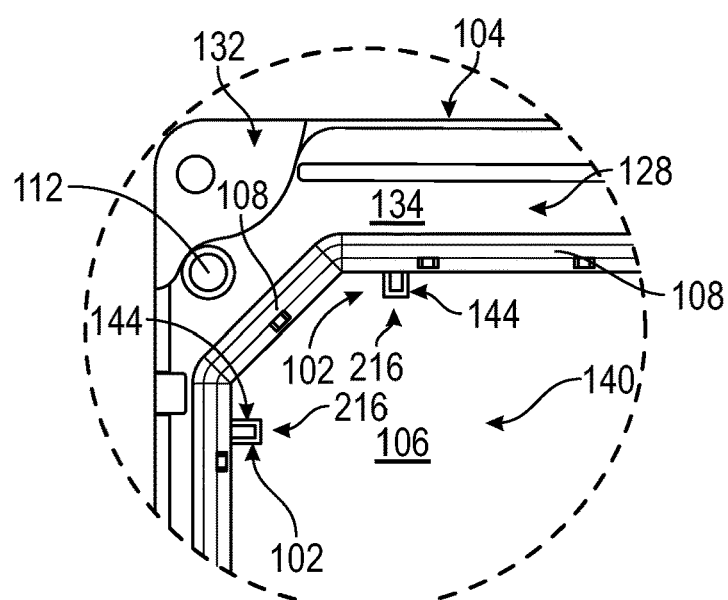
FIG. 14 is a magnified view of area 14-14 shown in FIG. 13.

As shown in FIG. 13, a first set of notches 220 of the plurality of notches 216 is disposed on a third axis 221. In the illustrated embodiment, the third axis 221 is disposed parallel to the lengthwise axis 201 of the electronic assembly 106, between the lengthwise axis 201 and the first side 206, and is coaxial with the first axis 169 on which the first set of electronic assembly projections 168 is disposed. However, alternative embodiments can include a third axis that disposed at any suitable angle relative to a lengthwise axis of an electronic assembly, is positioned at any suitable location relative to a lengthwise axis of an electronic assembly and a side of an electronic assembly, and/or is disposed at any suitable angle relative to a first axis. Each projection of the first set of electronic projections 168 is disposed within a notch of the first set of notches 220. A second set of notches 222 of the plurality of notches 216 is disposed on a fourth axis 223 that is disposed at an angle relative to the third axis 221. In the illustrated embodiment, the fourth axis 223 is disposed perpendicular to the third axis 221, closer to the first end 202 than the second end 204, and coaxial with the second axis 171 on which the second set of electronic assembly projections 170 is disposed. However, alternative embodiments can include a fourth axis that disposed at any suitable angle relative to a third axis, is positioned at any suitable location relative to a side of an electronic assembly, and/or is disposed at any suitable angle relative to a second axis. Each projection of the second set of electronic assembly projections 170 is disposed within a notch of the second set of notches 222. Each notch of the plurality of notches 216 surrounds a projection of the plurality of electronic assembly projections 144.

The mating configuration between the plurality of electronic assembly projections 144 defined by the housing 104 and the plurality of notches 216 provides a first mechanical tolerance compensatory element 102. The first mechanical tolerance compensatory element 102 provides a mechanism for maintaining the position of the electronic assembly 106 along the x and y axes, as shown in FIG. 13, relative to the housing 104 and allows for expansion of the electronic assembly 106 during use. For example, the mating configuration between the plurality of electronic assembly projections 144 defined by the housing 104 and the plurality of notches 216 defined by the electronic assembly 106 prevents mechanical stresses from being applied to the electronic assembly 106 during assembly and later temperature-dependent expansions of the components during use (e.g., within a vehicle). In addition, the structural arrangement between the housing 104 and the electronic assembly 106 allows the electronic assembly 106 to move freely or expand in all directions in the x-y plane without mechanical stress being imparted onto the electronic assembly 106 in the event of thermal expansions of the components during use (e.g., those caused by temperature fluctuations). While the mating configuration between the plurality of electronic assembly projections 144 defined by the housing 104 and the plurality of notches 216 defined by the electronic assembly 106 have been illustrated as providing mating structures for centering an electronic assembly, while allowing expansion, within a housing, any suitable mating structures between a housing and an electronic assembly can be utilized to center an electronic assembly within a housing and allow for expansion.

Any suitable electronic assembly, formed of any suitable material, having any suitable structural arrangement, including any suitable electronic components, and manufactured using any suitable technique or method of manufacture can be included in a container 100 that has a mechanical tolerance compensatory element and selection of a suitable electronic assembly to include in a container having a mechanical tolerance compensatory element can be based on various considerations, including the intended use of the container and/or electronic assembly. Examples of electronic assemblies considered suitable to include in a container having a mechanical tolerance compensatory element include electromagnetic-compatibility (EMC) components, such as printed circuit boards (PCBs), and any other electronic assembly considered suitable for a particular embodiment. Furthermore, while an electronic assembly 106 has been illustrated as included in the container 100 and as directly contacting the housing 104, any suitable component can be disposed between a housing and a cover, as described herein, an electronic assembly can indirectly contact a housing, or a container can omit the inclusion of an electronic assembly. Optionally, an electronic assembly can include one or more gap filler members that are attached to a main body of the electronic assembly and contact a cover to provide additional support for the electronic assembly during use.

The first sealing member 108 is disposed between the housing 104 and the cover 110 and extends entirely around the electronic assembly recess 140. The first sealing member 108 has a lengthwise axis 225, a top surface 226, a bottom surface 228, and a main body 230 that defines a plurality of sides 232. The first sealing member 108 is formed of a material capable of being compressed between the housing 104 and the cover 110 using the plurality of attachment members 112 and providing a seal between the housing 104 and the cover 110 such that material disposed exterior to the chamber 238 cooperatively defined by the housing 104 and the cover 110, as described in more detail herein, is prevented from entering the chamber 238.

Any suitable sealing member, formed of any suitable material, having any suitable structural arrangement, and manufactured using any suitable technique or method of manufacture can be included in a container 100 that has a mechanical tolerance compensatory element. Selection of a suitable sealing member to include in a container having a mechanical tolerance compensatory element can be based on various considerations, including the intended use of the container and/or electronic assembly. For example, a sealing member can comprise a sealant that is applied to a housing prior to attachment of a cover to the housing. Optionally, depending on the intended use of a container, a first sealing member can be omitted from a container and/or provided separately.

Figure 10:
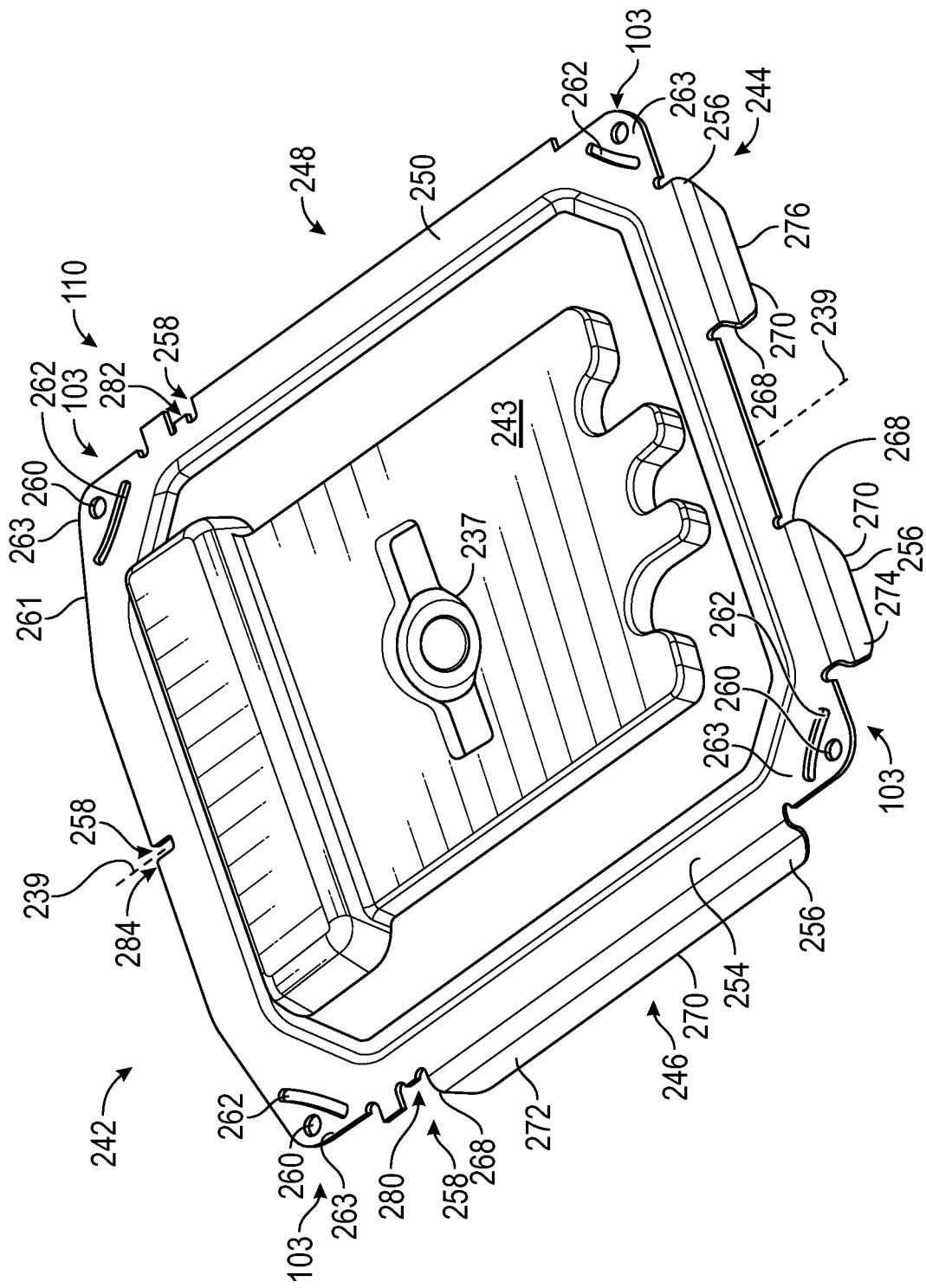
FIG. 10 is a top perspective view of the cover of the container illustrated in FIG. 3.
Figure 11:
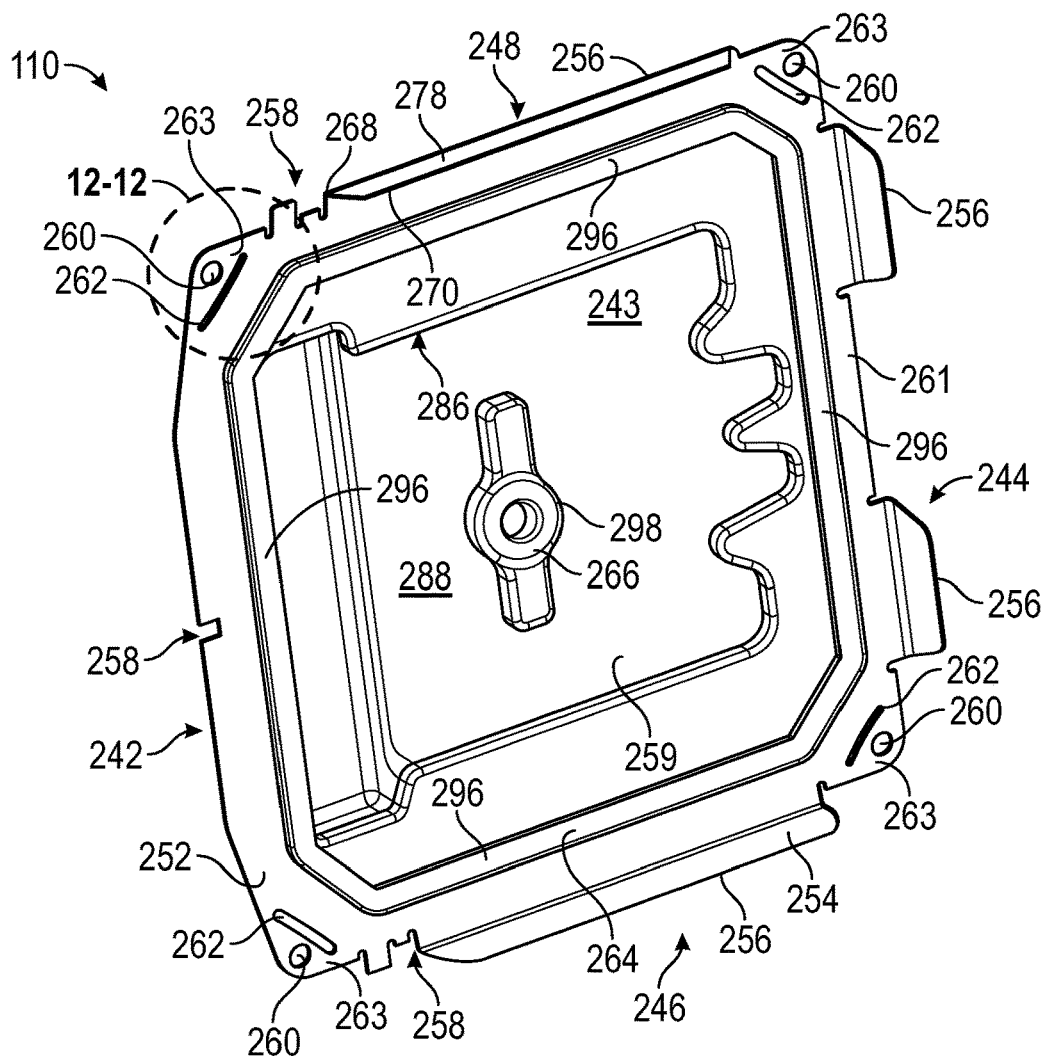
FIG. 11 is a bottom perspective view of the cover of the container illustrated in FIG. 3.
Figure 12:
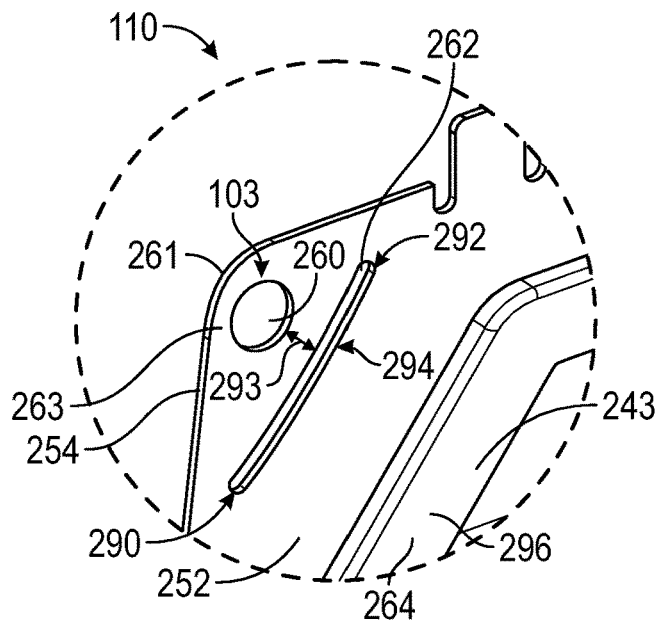
FIG. 12 is a magnified view of area 12-12 shown in FIG. 11.

In the illustrated embodiment, the cover 110 is releasably attached to the housing 104 using the plurality of attachment members 112 and directly contacts the electronic assembly 106 such that the electronic assembly 106 is retained between the housing 104 and the cover 110. However, in alternative embodiments, a cover can be attached to a housing in any suitable manner, such as permanently attached. When assembled, the housing 104 and the cover 110 cooperatively define a chamber 238 within which the electronic assembly 106 is disposed. As shown in FIGS. 10, 11, and 12, the cover 110 has a center 237, a lengthwise axis 239, a first end 242, a central portion 243, a second end 244, a first side 246, a second side 248, a top surface 250, a bottom surface 252, and a main body 254 that defines a plurality of flanges 256, a plurality of notches 258, a recess 259, a plurality of attachment member passageways 260, an outer edge 261, a plurality of slots 262, a plurality of flexible portions 263, a first projection 264, and a second projection 266. The bottom surface 252 of the cover 110 is a planar surface that is sized to be received by the first sealing member 108 and the receiving surface 134 defined by the cover 110. However, alternative embodiments can include a cover that defines a bottom surface that is not planar.

Each flange of the plurality of flanges 256 has a bend 268 and a flange end 270. A first flange 272 of the plurality of flanges 256 extends from the first side 246 away from the second side 248 to a bend 268 and from the bend 268 away from the top surface 250 to a flange end 270. A second flange 274 of the plurality of flanges 256 extends from the second end 244 away from the first end 242 to a bend 268 and from the bend 268 and away from the top surface 250 to a flange end 270. A third flange 276 of the plurality of flanges 256 extends from the second end 244 away from the first end 242 to a bend 268 and from the bend 268 and away from the top surface 250 to a flange end 270. A fourth flange 278 of the plurality of flanges 256 extends from the second side 248 away from the first side 246 to a bend 268 and from the bend 268 away from the top surface 250 to a flange end 270.

Figure 3:
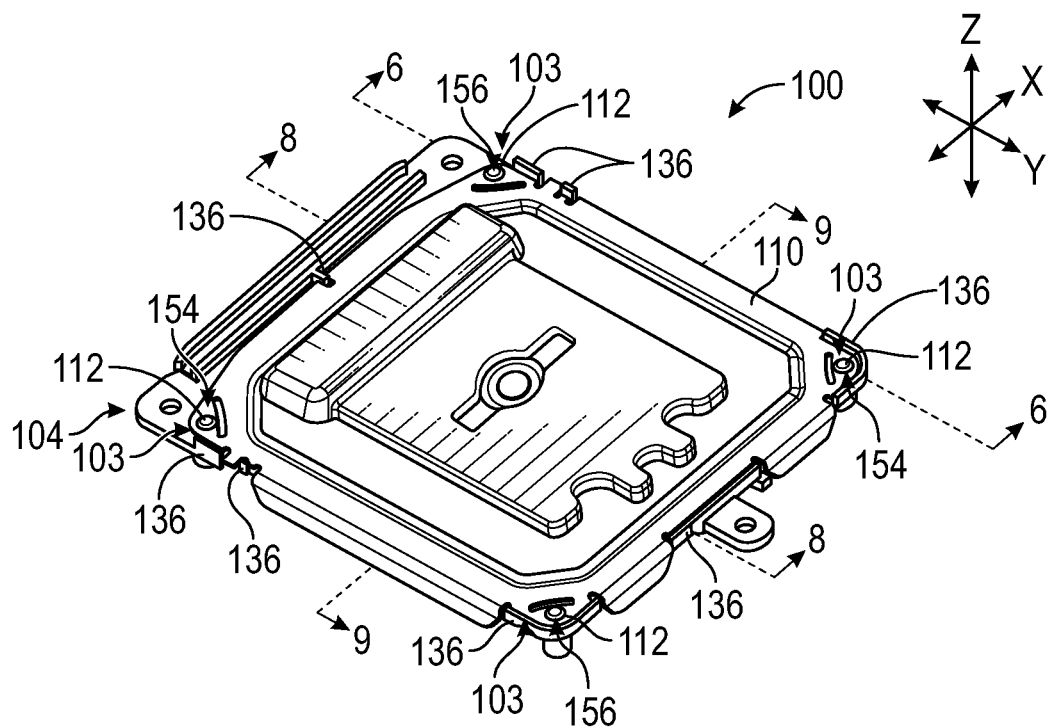
FIG. 3 is a top perspective view of a first embodiment of a container that has a mechanical tolerance compensatory element.
Figure 4:
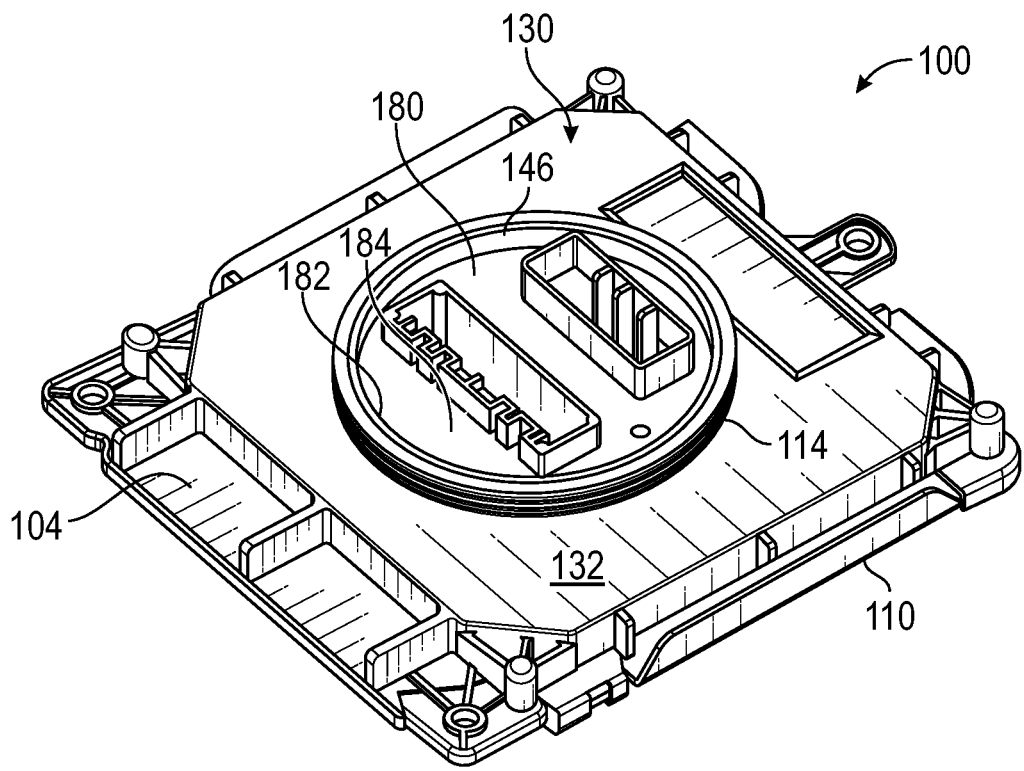
FIG. 4 is a bottom perspective view of the container illustrated in FIG. 3.

As shown in FIG. 10, a first notch 280 of the plurality of notches 258 extends into the main body 254 from the first side 246 and toward the lengthwise axis 239. A second notch 282 of the plurality of notches 258 extends into the main body 254 from the second side 248 and toward the lengthwise axis 239. A third notch 284 of the plurality of notches 258 extends into the main body 254 from the first end 242 and toward the second end 244. Each of the first notch 280, the second notch 282, and the third notch 284 is sized to receive a projection of the plurality of projections 136 defined by the housing 104. The mating configuration between the plurality of flanges 256 and the housing 104 and between the plurality of projections 136 defined by the housing 104 and the plurality of notches 258 defined by the cover 110 provides a mechanism for maintaining the position of the cover 110 along the x and y axes, as shown in FIG. 3, relative to the housing 104. The recess 259 extends into the main body 254 from the bottom surface 252 toward the top surface 250. The recess 259 is defined by a recess sidewall 286 and a recess base 288.

Each passageway of the plurality of attachment member passageways 260 extends through the main body 254 from the top surface 250 to the bottom surface 252 and is coaxial with an attachment member recess of the plurality of attachment member recesses 138 defined by the housing 104. In the illustrated embodiment, each passageway of the plurality of attachment member passageways 260 is disposed between the outer edge 261 of the cover 110 and a slot of the plurality of slots 262. Each passageway of the plurality of attachment member passageways 260 is sized to receive a portion of an attachment member of the plurality of attachment members 112.

Each slot of the plurality of slots 262 is disposed between a passageway of the plurality of attachment member passageways 260 and the center 237. In the illustrated embodiment, each slot of the plurality of slots 262 is disposed between a passageway of the plurality of attachment member passageways 260 and the first projection 264. Each slot of the plurality of slots 262 extends through the main body 254 from the top surface 250 to the bottom surface 252 and is disposed adjacent to a passageway of the plurality of attachment member passageways 260. As shown in FIG. 12, each slot of the plurality of slots 262 has a first end 290, a second end 292, and a curve 294 defined between the first end 290 and the second end 292. The curved 294 extends toward the center 237 of the cover 110. In the illustrated embodiment, each slot of the plurality of slots 262 is disposed a distance 293 from a passageway of the plurality of attachment member passageways 250 that is greater than the distance 311 from the outer edge 306 of the head 302 to the outer edge 308 of the shaft 304 of an attachment member of the plurality of attachment members 112, as described in more detail herein.

The plurality of flexible portions 263 are moveable relative to the central portion 243. Each flexible portion of the plurality of flexible portions 263 extends from a slot of the plurality of slots 262 to the outer edge 261 and includes an attachment member passageway of the plurality of attachment member passageways 260. In the illustrated embodiment, each slot of the plurality of slots 262 and its respective flexible portion of the plurality flexible portions provide the second mechanical tolerance compensatory element 103. The second mechanical tolerance compensatory element 103 allows the cover 110 to have flexibility in the z-direction (e.g., along the plurality of flexible portions 263), as shown in FIGS. 3, 6, and 7, and allows, even with the largest and smallest dimensions for the housing 104, electronic assembly 106, and/or cover 110 (e.g., minimum tolerances, maximum tolerances), for temperature fluctuations during use of the container 100, a smooth and even contact pressure on the electronic assembly 106 from the housing 104 and the cover 110, an overall reduction on stress to the electronic assembly 106 relative to containers that do not include the structural arrangements described herein, and a continuous, defined electromagnetic-compatibility (EMC) contact area between the cover 110 and the electronic assembly 106.

While each slot of the plurality of slots 262 has been illustrated as having a particular structural arrangement and as being positioned at a particular location on the cover 110, a slot included on a cover can have any suitable structural arrangement and be positioned at any suitable location on a cover that provides a mechanical tolerance compensatory element, as described herein. Selection of a suitable structural arrangement for a slot included on a cover and of a particular location to position a slot can be based on various considerations, including the desired amount of flexibility intended to impart on a cover included in a container. For example, a slot can define one or more curves or omit the inclusion of a curve and/or include a slot disposed a distance from an attachment member passageway that is less than the distance from an outer edge of a head of an attachment member to an outer edge of a shaft of the attachment member.

The first projection 264 extends from the bottom surface 252, away from the top surface 250 to a first projection end 296, and into the electronic assembly recess 140 such that the entire first projection 262 directly contacts the electronic assembly 106. As shown in FIG. 8, the first projection 264 extends from the bottom surface 252 to the first projection end 296 a distance 297 and has an outer perimeter that is the same shape as the perimeter of the electronic assembly 106 but has dimensions that are smaller than the dimensions of the electronic assembly. The distance 297 is greater than the distance from the top surface 210 of the electronic assembly 106 to a hypothetical plane 211 that includes the receiving surface 134. However, alternative embodiments can include a first projection that has a perimeter that does not have the same shape as the perimeter of an electronic assembly, that only partially contacts an electronic assembly, and/or that has a height that is greater than, equal to, or less than a distance from a top surface of an electronic assembly to a hypothetical plane that includes a receiving surface defined by a housing. Furthermore, while only a single first projection has been illustrated, a cover of a container can define a plurality of first projections that each extend from a bottom surface of the cover, away from a top surface of the cover, to a projection end. Each projection of the plurality of first projections can be positioned adjacent to an attachment member passageway defined by a cover to achieve the various functions described herein relative to the first projection 264.

The second projection 266 extends from the recess base 288, away from the top surface 250, and to a second projection end 298. As shown in FIG. 8, the second projection 266 extends from the recess base 288 to the second projection end 298 a distance 299. The second projections 266 extends into the electronic assembly recess 140 and contacts the electronic assembly 106 when the container 100 is assembled.

While the cover 110 has been illustrated as having a particular structural arrangement, a cover can have any suitable structural arrangement and selection of a suitable structural arrangement for a cover can be based on various considerations, including the type of electronic assembly intended to be positioned between a housing and a cover. For example, a cover can include any suitable number of flanges, notches, recesses, attachment member passageways, slots, flexible portions, and/or projections. Alternatively, a cover can omit the inclusion of an attachment member passageway, or plurality of attachment member passageways, and include an attachment member portion that can include any suitable structure that can be used to accomplish attachment between a housing and a cover. For example, a cover can define a support post that can be passed through a passageway defined by a housing and used to attach the cover to the housing (e.g., using a bolt). Furthermore, while the cover 110 has been illustrated as directly contacting the electronic assembly 106, a cover can alternatively indirectly contact an electronic assembly.

A cover can be formed of any suitable material using any suitable technique or method of manufacture and selection of a suitable material to form a cover and of a suitable technique or method to manufacture a cover can be based on various consideration, such as the material forming a housing to which the cover is intended to be releasably attached. Examples of materials considered suitable to form a cover include plastics, metals, such as aluminum, alloys, and any other material considered suitable for a particular embodiment. Examples of techniques and methods of manufacture considered suitable to form a cover include pressing, molding, such as injection molding, and any other technique or method of manufacture considered suitable for a particular embodiment. In the illustrated embodiment, the cover 110 is formed of aluminum. Optionally, a cover can include one or more gap filler members that are attached to a main body of the cover and contact an electronic assembly to provide additional support for the electronic assembly during use.

Each attachment member of the plurality of attachment members 112 is releasably attached to the housing 104 and extends through the cover 110. However, in alternative embodiments, each attachment member of a plurality of attachment members can be attached to a housing in any suitable manner, such as permanently attached. In the illustrated embodiment, each attachment member of the plurality of attachment members 112 is partially disposed through an attachment member passageway of the plurality attachment member passageways 260 defined by the cover 110, is partially disposed within an attachment member recess of the plurality of attachment member recesses 138 defined by the housing 104, and is free from attachment (e.g., direct attachment) to the electronic assembly 106 (e.g., no attachment member of the plurality of attachment members 112 extends through the electronic assembly 106). Thus, each attachment member of the plurality of attachment members 112 passes through an attachment member passageway of the plurality attachment member passageways 260 defined by the cover 110, does not pass through a portion of the electronic assembly 106, and is in threaded engagement with the housing 104 within an attachment member recess of the plurality of attachment member recesses 138 defined by the housing 104. In the illustrated embodiment, free from direct attachment to the housing 104 indicates that an attachment member of the plurality of attachment members 112 that is attached to the housing 104 does not pass through the electronic assembly 106, allowing any thermal expansion of the housing 104, electronic assembly 106, and/or cover 110 during use to occur while reducing, or preventing, the mechanical stress imparted on the electronic assembly 106, as described in more detail herein.

Figure 5:
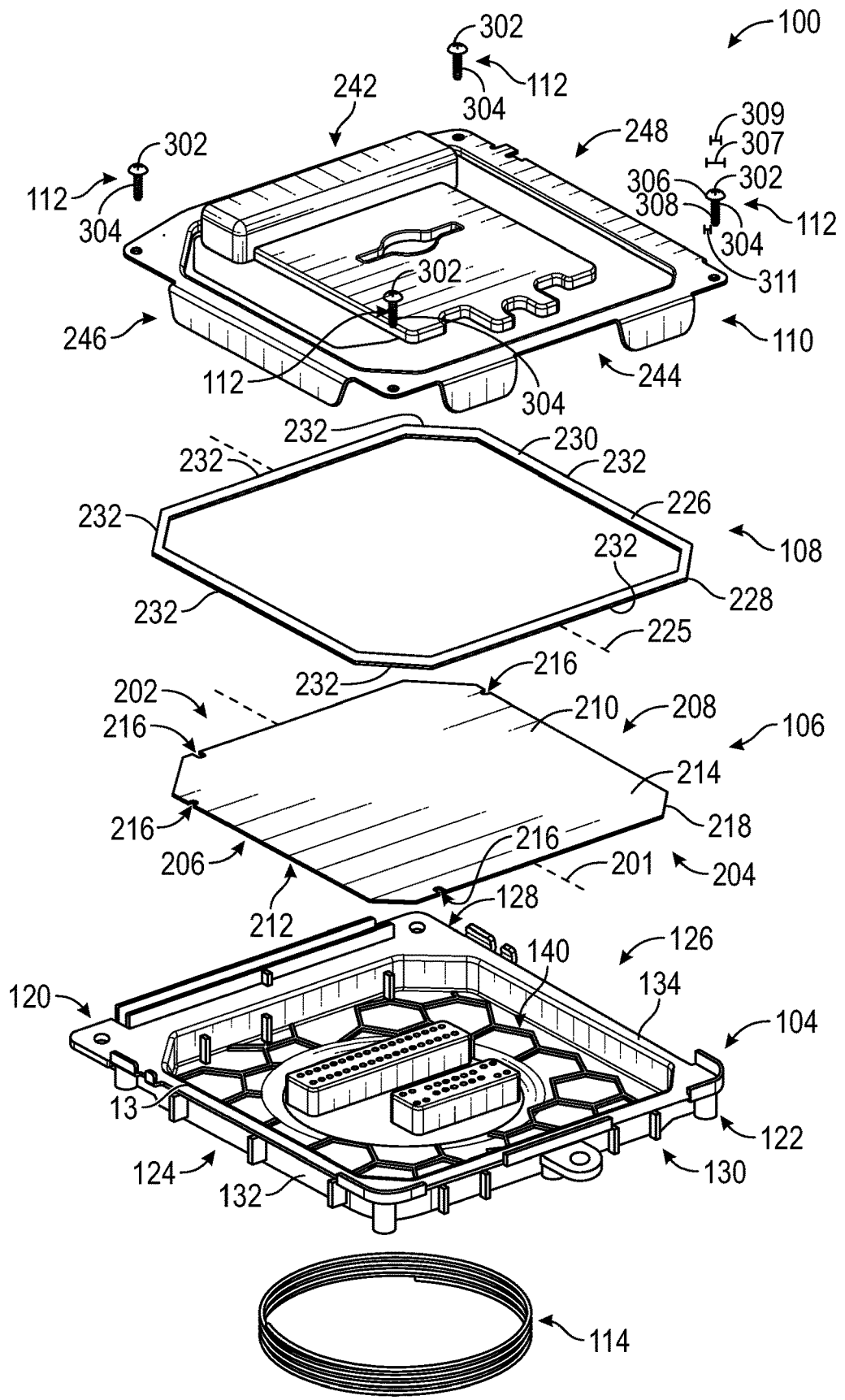
FIG. 5 is an exploded perspective view of the container illustrated in FIGS. 3 and 4.

Alternative embodiments, however, can include an attachment member, or a plurality of attachment members that pass through a passageway defined by an electronic assembly or that is/are disposed on an attachment member portion defined by a housing and/or an attachment member portion defined by a cover. For example, in alternative embodiments, each attachment member of a plurality of attachment members can be partially disposed through an attachment member passageway of a plurality attachment member passageways defined by a cover, be partially disposed through a passageway of a plurality of passageways defined by an electronic assembly, and be partially disposed within an attachment member recess of a plurality of attachment member recesses defined by a housing. As shown in FIG. 5, each attachment member of the plurality of attachment members 112 has a head 302 and a threaded shaft 304. The head 302 has an outer edge 306 and an outside diameter 307. The shaft 304 has an outer edge 308 and an outside diameter 309 that is less than the outside diameter 303 of the head 302. The outer edge 306 of the head 302 is disposed a distance 311 from the outer edge 308 of the shaft 304.

Any suitable type and number of attachment members, formed of any suitable material, and manufactured using any suitable technique or method of manufacture can be included in a container 100 that has a mechanical tolerance compensatory element and selection of a suitable type and number of attachment members to include in a container having a mechanical tolerance compensatory element can be based on various considerations, including the material used to form a housing to which an attachment member is intended be attached. Examples of attachment members considered suitable to include in a container having a mechanical tolerance compensatory element include threaded members, screws, bolts, rivets, structures that provide a snap-fit connection between a housing and a cover, attachment members that provide a permanent attachment between a housing and a cover, and any other attachment member considered suitable for a particular embodiment.

As shown in FIG. 9, in the z-direction, the electronic assembly 106 is clamped between the cover 110 and housing 104 (e.g., by means of sandwich shoring using counter-bearing elements). When being assembled, the plurality of slots 262 defined by the cover 110 provide flexibility to the plurality of flexible portions 263 of the cover 110 to compensate for tolerances of the various components included in the container 110. For example, in the illustrated embodiment, the plurality of slots 262 provide flexibility to the plurality of flexible portions 263 to compensate for the sum minimum and/or maximum tolerances of the distance 219 from the electronic assembly recess base 152 to the electronic assembly 106, the thickness 213 of the electronic assembly 106, and the height 297 from the bottom surface 252 of the cover 110 to the first projection end 296. By incorporating the slots 262 and plurality of flexible portions 263 into the cover 110, a moveable mechanical tolerance compensatory element 103 is provided in which the individual part tolerances of the housing 104, electronic assembly 106, first sealing member 108, and/or cover 110, their relative temperature-dependent expansions, and stresses arising as a result of temperature fluctuations, can be accommodated in the z-direction during assembly and during use without subjecting the components to additional, or unwanted, mechanical stress. This adaptable feature (e.g., built-in flexibility of the cover 110 along the plurality of flexible portions 263) enables, even with the largest and smallest dimensions of the housing 104, electronic assembly 106, first sealing member 108, and/or cover 110, or with temperature fluctuations during service, an even contact pressure, an arrangement as free of voltage as possible, and a continuous, defined contact surface of the cover 110 on the electronic assembly 106 (e.g., via the first projection 264). For example, as shown in FIG. 7, a gap can be disposed between the housing 104 and the cover 110 along a flexible portion 263 of the cover 110, or along each flexible portion 260 of the cover 110, which accounts for the tolerance in the z-direction of the electronic assembly 106 (e.g., +/−10% of the thickness). If the thickness of the electronic assembly 106 is minimum, the gap allows the flexible portion 263 to move and/or adapt during assembly (e.g., when an attachment member 112 is passed through the cover 110 and attached to the housing 104) to generate a desired contact pressure of the cover 110 on the electronic assembly 106. A gap included between a housing and a cover can have any suitable height disposed between the housing and the cover measured along an axis that is perpendicular to a plane that contains a lengthwise axis of the cover. For example, a gap can have a height that is equal to, greater than, or less than the sum of the maximum tolerances, the sum of the minimum tolerances, or between the sum of the maximum tolerances and the sum of the minimum tolerances, of a distance from an electronic assembly recess base to an electronic assembly, a thickness of the electronic assembly, and a height from a bottom surface of a cover to a first projection end. Alternatively, a gap can have a height that is equal to, greater than, or less than the total tolerance in the z-direction of an electronic assembly.

Furthermore, by passing the plurality of attachment members 112 through the cover 110 and into the housing 104, without passing the plurality of attachment members 112 through the electronic assembly 106, mechanical stresses are not applied to the electronic assembly 106 directly by the plurality of attachment members 112 and prevents additional mechanical stresses from being applied to the electronic assembly 106 during assembly and later thermal expansion of the components during use (e.g., within a vehicle). As a result of the structural arrangement between the housing 104, electronic assembly 106, the first sealing member 108, the cover 110, and plurality of attachment members 112, the container 110 allows the electronic assembly 106 to move freely or expand in all directions of the x-y plane and in the z-direction without mechanical stress in the event of thermal expansions of the components.

As shown in FIGS. 8 and 9, the second sealing member 114 is disposed on the base projection 146 of the housing 104, extends around the entire base projection 146, has a first end 310, a second end 312, and a main body 314 that defines a plurality of projections 316 that assist with providing a seal between the second sealing member 114 and a component to which the container 100 is attached. For example, the base projection 146 of the container 100 can be disposed within a secondary component and the second sealing member 114 provides a seal between the secondary component and the container 100. The second sealing member 114 is formed of a material capable of being compressed between the housing 104 and a secondary component within which the base projection 146 is disposed when the container 100 is attached to the secondary component and providing a seal between the housing 104 and the secondary component such that material disposed exterior to the chamber 238 cooperatively defined by the housing 104 and the cover 110 is prevented from entering the chamber 238.

Any suitable sealing member, formed of any suitable material, having any suitable structural arrangement, and manufactured using any suitable technique or method of manufacture can be included in a container 100 that has a mechanical tolerance compensatory element 102. Selection of a suitable sealing member to include in a container having a mechanical tolerance compensatory element can be based on various considerations, including the intended use of the container and/or electronic assembly. Optionally, depending on the intended use of a container, a second sealing member can be omitted from a container and provided separately or another structure capable of accomplishing a seal between a container and a secondary component can be utilized.

Figure 17:
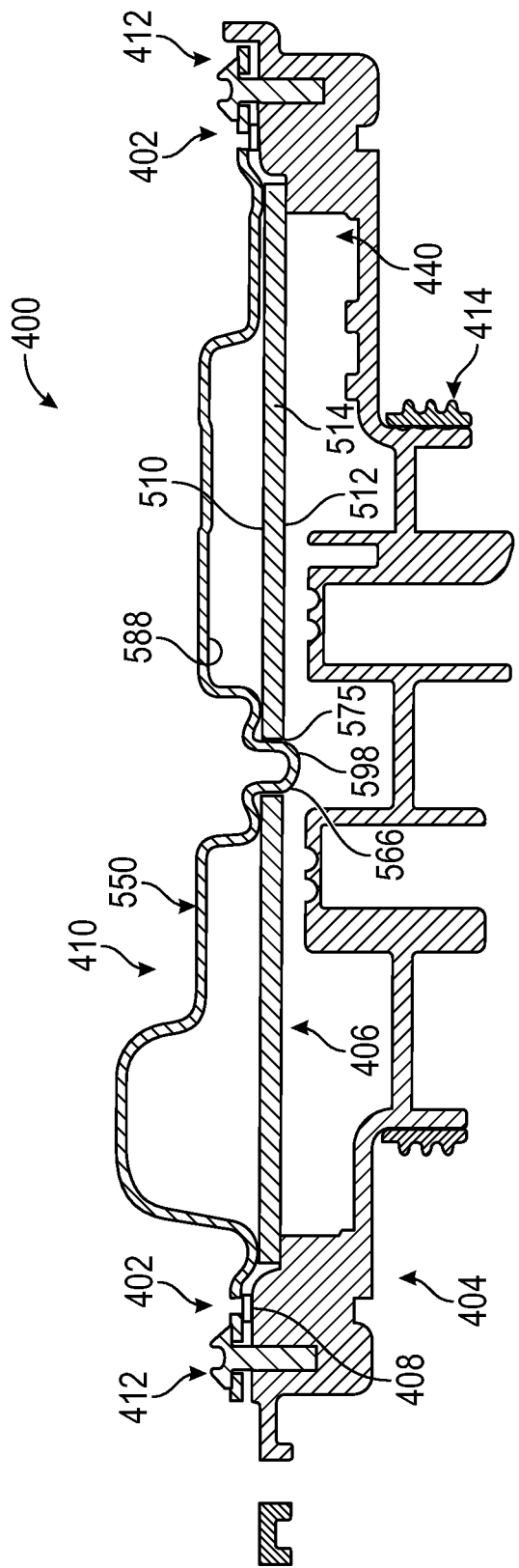
FIG. 17 is a cross-sectional view of a second embodiment of a container that has a mechanical tolerance compensatory element

FIG. 17 illustrates a second embodiment of a container 400 that has a mechanical tolerance compensatory element 402. In the illustrated embodiment, the container 400 has a housing 404, an electronic assembly 406, a first sealing member 408, a cover 410, a plurality of attachment members 412, and a second sealing member 414. The container 400 is similar to the container 100 illustrated in FIGS. 3 through 16 and described above, except as detailed below.

In the illustrated embodiment, the main body 514 of the electronic assembly 406 defines a passageway 515 that extends from the top surface 510 to the bottom surface 512 and is sized to receive a portion of the second projection 566 defined by the cover 410. The second projection 566 defined by the cover 410 extends from the recess base 588, away from the top surface 550, and to a second projection end 598. The second projections 566 extends into the electronic assembly recess 440, through the passageway 515 defined by the electronic assembly 406, and contacts the electronic assembly 106. This structural arrangement provides a mating configuration between the electronic assembly 406 and the cover 410 to accomplish centering of the electronic assembly 406 within a housing 404, which can be used in combination with, or alternative to, the mating structures described with respect to container 100 (e.g., mating configuration between the plurality of electronic assembly projections 144 defined by the housing 104 and the plurality of notches 216 defined by the electronic assembly 106).

Those with ordinary skill in the art will appreciate that various modifications and alternatives for the described and illustrated embodiments can be developed in light of the overall teachings of the disclosure, and that the various elements and features of one example described and illustrated herein can be combined with various elements and features of another example without departing from the scope of the invention. Accordingly, the particular examples disclosed herein have been selected by the inventor(s) simply to describe and illustrate examples of the invention and are not intended to limit the scope of the invention or its protection, which is to be given the full breadth of the appended claims and any and all equivalents thereof.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A container comprising:
   a housing defining an electronic assembly recess;
   an electronic assembly disposed within the electronic assembly recess and contacting the housing;
   a cover attached to the housing, the cover having a center and defining an attachment member portion, a slot, and a first projection, the slot disposed between the attachment member portion and the center of the cover, the first projection extending into the electronic assembly recess and contacting the electronic assembly such that the electronic assembly is retained between the housing and the cover; and
an attachment member disposed on the attachment member portion defined by the cover, the attachment member attaching the cover to the housing.

2. The container of claim 1, wherein the slot is disposed between the attachment member portion and the first projection.

3. The container of claim 1, wherein the cover has an outer edge, a central portion, and a flexible portion, the flexible portion moveable relative to the central portion and extending from the slot to the outer edge.

4. The container of claim 3, wherein the flexible portion includes the attachment member portion.

5. The container of claim 1, wherein the slot has a first end, a second end, and a curve defined between the first end and the second end and extending toward the center of the cover.

6. The container of claim 1, wherein the electronic assembly recess is bounded by an electronic assembly recess sidewall and an electronic assembly recess base, the housing defines a support member extending from the electronic assembly recess sidewall into the electronic assembly recess, and the electronic assembly is disposed on the support member within the electronic assembly recess.

7. The container of claim 6, wherein the electronic assembly has a thickness, the housing has a receiving surface, the electronic assembly recess extends from the receiving surface and into the housing, and wherein the support member is disposed a distance from the receiving surface that is greater than the thickness of the electronic assembly.

8. The container of claim 6, wherein the support member is entirely disposed within the electronic assembly recess.

9. The container of claim 1, wherein the electronic assembly recess is bounded by an electronic assembly recess sidewall and an electronic assembly recess base, the electronic assembly defines a notch, the housing defines an electronic assembly projection extending from the electronic assembly recess sidewall into the electronic assembly recess, and the electronic assembly projection is disposed within the notch defined by the electronic assembly.

10. The container of claim 9, wherein the electronic assembly has a thickness, the housing has a receiving surface, the electronic assembly recess extends from the receiving surface and into the housing, and the electronic assembly projection is disposed a distance from the receiving surface that is less than the thickness of the electronic assembly.

11. The container of claim 9, wherein the electronic assembly projection is entirely disposed within the electronic assembly recess.

12. The container of claim 9, wherein the electronic assembly defines a plurality of notches, the housing defines a plurality of electronic assembly projections that each extend from the electronic assembly recess sidewall into the electronic assembly recess and are disposed within a respective one of the plurality of notches defined by the electronic assembly, a first set of projections of the plurality of electronic assembly projections disposed on a first axis, and a second set of projections of the plurality of electronic assembly projections disposed on a second axis that is disposed at an angle relative to the first axis.

13. The container of claim 12, wherein the housing has a lengthwise axis, the first axis is parallel to the lengthwise axis of the housing, and the second axis is disposed perpendicular to the first axis.

14. The container of claim 1, wherein the cover is releasably attached to the housing.

15. The container of claim 1, wherein the housing is formed of plastic.

16. The container of claim 1, wherein the cover is formed of aluminum.

17. The container of claim 1, wherein the cover defines a recess and a second projection, the recess defined by the cover bounded by a recess sidewall and a recess base, the second projection extending from the recess base and into the electronic assembly recess, the second projection contacting the electronic assembly.

18. The container of claim 17, wherein the electronic assembly defines a passageway; and wherein the second projection extends through the passageway defined by the electronic assembly.

19. A container comprising:
a housing defining an attachment member recess, an electronic assembly recess, and a support member, the electronic assembly recess bounded by an electronic assembly recess sidewall and an electronic assembly recess base, the support member extending from the electronic assembly recess sidewall into the electronic assembly recess;
an electronic assembly disposed within the electronic assembly recess defined by the housing and directly contacting the housing, the electronic assembly disposed on the support member within the electronic assembly recess;
a cover attached to the housing, the cover having an outer edge, a central portion, a flexible portion, and defining an attachment member passageway, a slot, and a first projection, the flexible portion moveable relative to the central portion and extending from the slot to the outer edge, the slot disposed between the attachment member passageway and the first projection, the first projection extending into the electronic assembly recess and directly contacting the electronic assembly such that the electronic assembly is retained between the housing and the cover; and
an attachment member partially disposed through the attachment member passageway defined by the cover and partially disposed within the attachment member recess defined by the housing.

20. A container comprising:
a housing having a receiving surface and defining an attachment member recess, an electronic assembly recess, a support member, and an electronic assembly projection, the electronic assembly recess extending from the receiving surface and into the housing, the electronic assembly recess bounded by an electronic assembly recess sidewall and an electronic assembly recess base, the support member extending from the electronic assembly recess sidewall into the electronic assembly recess, the electronic assembly projection extending from the electronic assembly recess sidewall into the electronic assembly recess;
an electronic assembly disposed within the electronic assembly recess defined by the housing and directly contacting the housing, the electronic assembly having a thickness, defining a notch, and disposed on the support member within the electronic assembly recess;

a cover attached to the housing, the cover having an outer edge, a central portion, a flexible portion, and defining an attachment member passageway, a slot, and a first projection, the flexible portion moveable relative to the central portion and extending from the slot to the outer edge, the flexible portion including the attachment member passageway, the slot disposed between the attachment member passageway and the first projection, the first projection extending into the electronic assembly recess and directly contacting the electronic assembly such that the electronic assembly is retained between the housing and the cover; and an attachment member partially disposed through the attachment member passageway defined by the cover and partially disposed within the attachment member recess defined by the housing;

wherein the support member is disposed a distance from the receiving surface that is greater than the thickness of the electronic assembly; and wherein the electronic assembly projection is disposed within the notch defined by the electronic assembly.

\* \* \* \* \*